(12) United States Patent
Tung

(10) Patent No.: US 11,962,263 B2
(45) Date of Patent: Apr. 16, 2024

(54) SOLAR PANEL ASSEMBLY AND SOLAR POWER SYSTEM INCLUDING SAME

(71) Applicant: SUN RISE E & T CORPORATION, Pingtung (TW)

(72) Inventor: Chi-Hsu Tung, Pingtung (TW)

(73) Assignee: SUN RISE E & T CORPORATION, Pingtung (TW)

( * ) Notice: Subject to any disclaimer, the term of this patent is extended or adjusted under 35 U.S.C. 154(b) by 72 days.

(21) Appl. No.: 17/141,939

(22) Filed: Jan. 5, 2021

(65) Prior Publication Data

US 2022/0103114 A1 Mar. 31, 2022

(30) Foreign Application Priority Data

Sep. 26, 2020 (TW) .................................. 109133488

(51) Int. Cl.
*H02S 10/40* (2014.01)
*B63B 35/44* (2006.01)
*H02S 30/10* (2014.01)
*H02S 40/22* (2014.01)

(52) U.S. Cl.
CPC .............. *H02S 10/40* (2014.12); *B63B 35/44* (2013.01); *H02S 30/10* (2014.12); *H02S 40/22* (2014.12); *B63B 2035/4453* (2013.01)

(58) Field of Classification Search
CPC .......... H02S 10/40; H02S 30/10; H02S 40/22; H02S 20/00; H02S 20/30; B63B 35/44; B63B 2035/4453; B63B 2209/18; Y02E 10/47; Y02E 10/52; Y02E 10/50; F24S 20/70; H01L 31/042
See application file for complete search history.

(56) References Cited

U.S. PATENT DOCUMENTS

| | | | |
|---|---|---|---|
| 9,712,107 B2 | 7/2017 | Tung | |
| 2006/0090789 A1 | 5/2006 | Thompson | |
| 2011/0233157 A1* | 9/2011 | Kmita | ..................... H02S 20/24 211/41.1 |
| 2012/0273023 A1* | 11/2012 | Ely | ....................... F24S 30/425 136/246 |

(Continued)

FOREIGN PATENT DOCUMENTS

| | | | |
|---|---|---|---|
| CN | 201450470 U | 5/2010 | |
| CN | 101834549 A * | 9/2010 | ............... F24J 2/523 |

(Continued)

OTHER PUBLICATIONS

English machine translation of CN-107196594-A (Year: 2022).*

(Continued)

*Primary Examiner* — Angelo Trivisonno
(74) *Attorney, Agent, or Firm* — MUNCY, GEISSLER, OLDS & LOWE, P.C.

(57) ABSTRACT

A solar panel assembly includes a base having tubular bodies, a support unit including support frames connected between the tubular bodies and supporting rods extending upwardly from the supporting frames, a solar power panel disposed on the supporting rods, and a reflector plate disposed between the base and the solar panel to reflect light rays to a bottom surface of the solar panel. A solar power system includes a plurality of the aforesaid solar panel assemblies and multiple connectors.

9 Claims, 13 Drawing Sheets

(56) References Cited

U.S. PATENT DOCUMENTS

| | | | |
|---|---|---|---|
| 2014/0216522 A1* | 8/2014 | Au | H02S 20/32 |
| | | | 136/246 |
| 2016/0352284 A1* | 12/2016 | Tung | H02S 30/10 |
| 2017/0370621 A1* | 12/2017 | Port | F24S 20/70 |
| 2018/0278199 A1 | 9/2018 | Chang | |
| 2019/0134822 A1 | 5/2019 | Clemenzi et al. | |

FOREIGN PATENT DOCUMENTS

| | | | | |
|---|---|---|---|---|
| CN | 203761322 U | * | 8/2014 | F24J 2/5203 |
| CN | 107196594 A | * | 9/2017 | |
| CN | 210958242 U | * | 7/2020 | |
| JP | H11330523 A | | 11/1999 | |
| JP | 2020096494 A | | 6/2020 | |
| KR | 101535511 B1 | | 7/2015 | |
| KR | 20160001553 A | | 1/2016 | |

OTHER PUBLICATIONS

English machine translation of CN 101834549A (Year: 2024).*
English machine translation of CN 203761322 U (Year: 2024).*
English machine translation of CN 210958242U (Year: 2024).*
Examination Report issued to Indian counterpart application No. 202114001374 by the IPO dated Apr. 19, 2022.
Examination Report issued to Australian counterpart application No. 2021232848 by the IP Australia dated Jul. 19, 2022.
Search Report issued to European counterpart application No. 21152098.6 by the EPO dated Sep. 10, 2021.

* cited by examiner

SOLAR PANEL ASSEMBLY AND SOLAR POWER SYSTEM INCLUDING SAME

CROSS-REFERENCE TO RELATED APPLICATION

This application claims priority to Taiwanese Patent Application No. 109133488, filed on Sep. 26, 2020.

FIELD

The disclosure relates to a solar power system, and more particularly to a solar power system for floating on a water body.

BACKGROUND

As shown in FIGS. 1 and 2, a conventional solar power system includes a plurality of solar panel assemblies 1. Each solar panel assembly 1 includes a base 11 to float on a water body, a plurality of spaced-apart support units 12 disposed on the base 11, a plurality of solar power panels 13 dispose on the support units 12 above the base 11, and a plurality of connecting connectors 14 attached to the base 11. Each connector 14 is a flange disc. Each connector 14 of each of the solar panel assemblies 1 is screwed to an adjacent one of the connectors 14 of another one of the solar panel assemblies 1 such that the solar panel assemblies 1 are juxtaposed with each other in a matrix manner on the water body. The solar power panels 13 are used in concentrated solar power technologies, or photovoltaic power technologies.

However, the solar panel assemblies 1 need occupy a large installation area on the water body to sufficiently convert the solar energy into the power energy. In addition, only the sunlight rays directly reaching the solar power panels 13 can be absorbed thereby for energy conversion. Because the sunlight rays missing the solar power panels 13 cannot be used for energy conversion, the conventional solar power system becomes ineffective in converting the solar energy into the electrical energy.

SUMMARY

Therefore, one object of the disclosure is to provide a solar panel assembly that can alleviate at least one of the drawbacks of the prior art.

According to one object of the disclosure, a solar panel assembly includes a base, a support unit, at least one solar power panel, and at least one reflector plate.

The base includes a plurality of tubular bodies extending along a first direction and spaced apart from each other in a second direction transverse to the first direction. The tubular bodies are configured to float on a water body.

The support unit is disposed on the base, and includes a plurality of supporting frames connected between the tubular bodies and a plurality of supporting rods extending upwardly from the supporting frames.

The at least one solar power panel is obliquely disposed on the supporting rods. The at least one solar power panel has a top surface and a bottom surface opposite to the top surface. The top and bottom surfaces are configured to convert light energy into electrical energy.

The at least one reflector plate is disposed between the base and the at least one solar panel to reflect light rays to the bottom surface.

Another object of the disclosure is to provide a solar power system.

According to another object of the disclosure, a solar power system includes a plurality of the solar panel assemblies of the disclosure mentioned hereinbefore. Each of the solar panel assemblies includes a plurality of connectors, in addition to the base, the support unit, the at least one solar power panel, and the at least one reflector plate.

Each of the connectors is attached to an end of one of the tubular bodies.

One of the connectors of each of the solar panel assemblies is joined to an adjacent one of the connectors of another one of the solar panel assemblies such that the bases of the solar panel assemblies are juxtaposed with each other along the first direction.

The bases of the solar panel assemblies are connected to each other in a spaced apart manner along a second direction transverse to the first direction.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
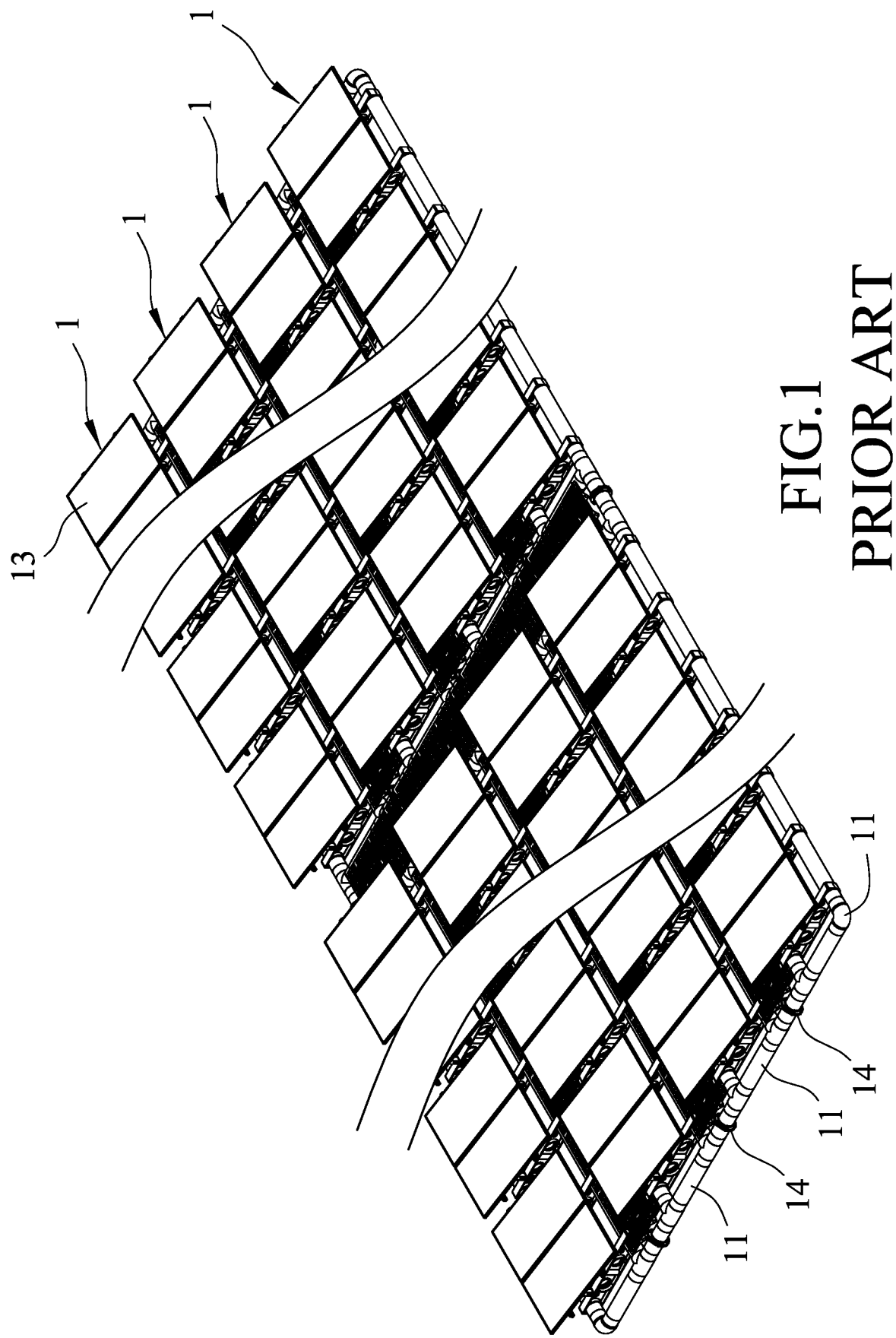
FIG. 1 is a perspective view illustrating a conventional solar power system.
Figure 2:
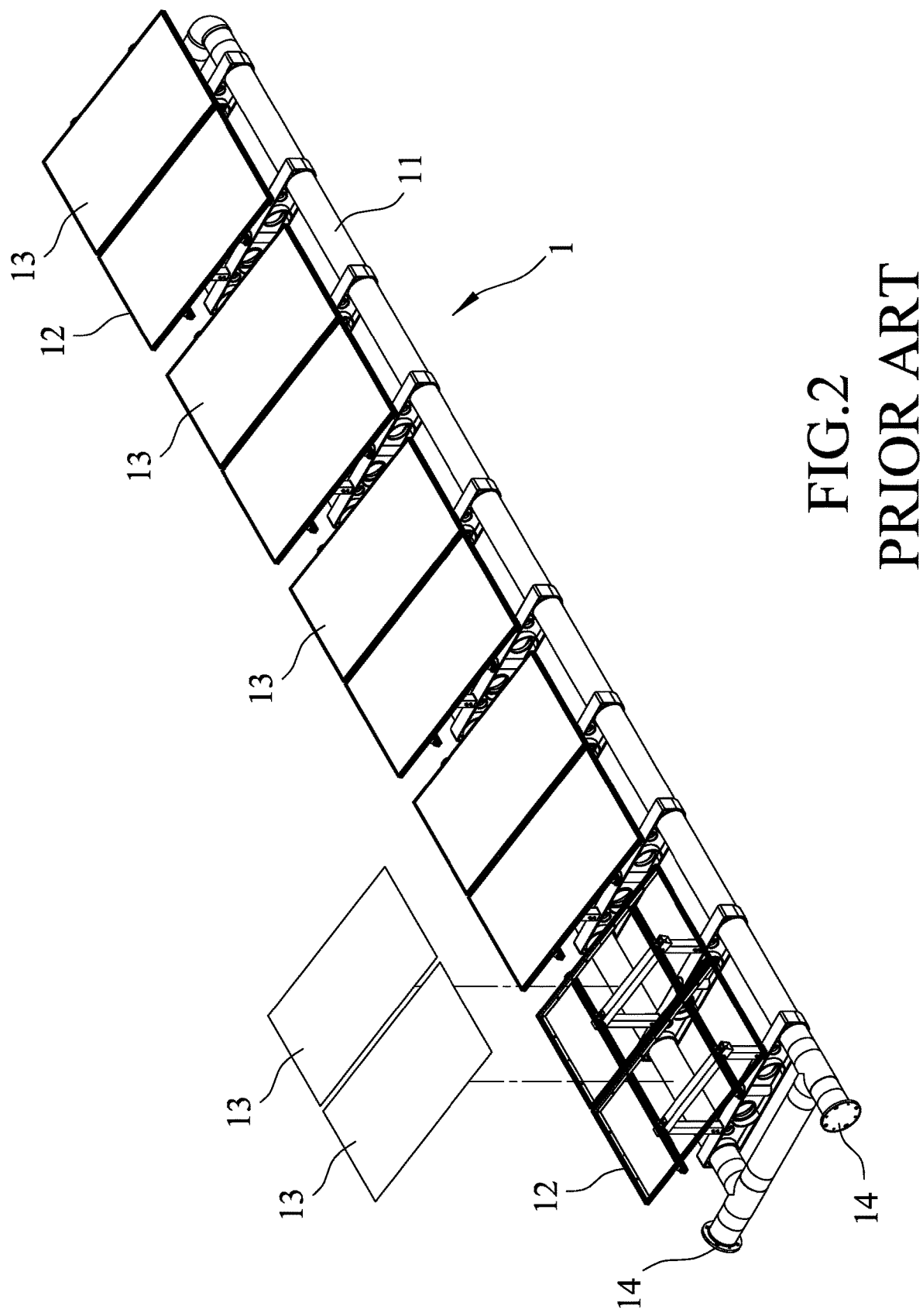
FIG. 2 is a partly exploded perspective view illustrating a solar panel assembly of the conventional solar power system.
Figure 3:
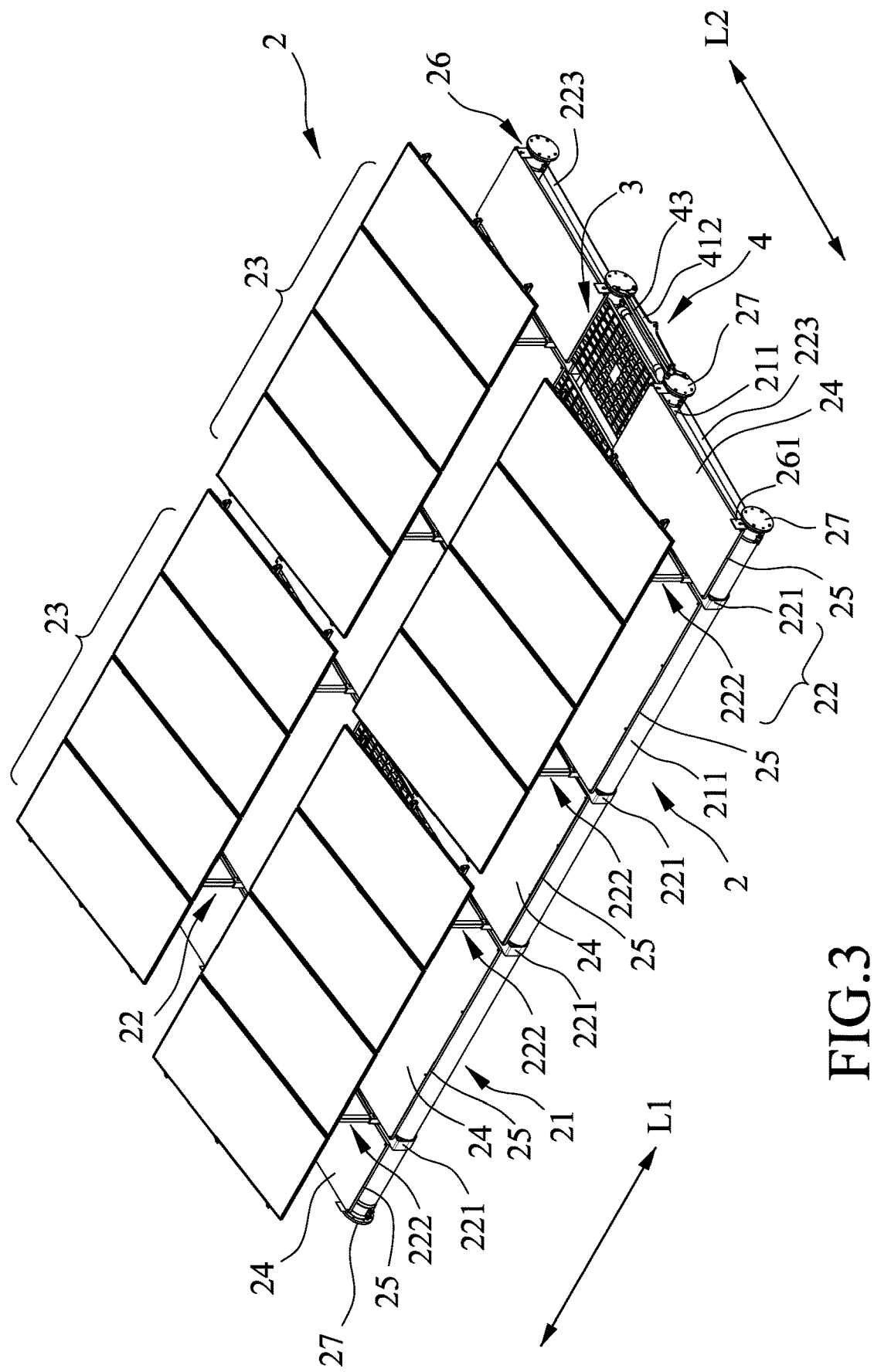
FIG. 3 is a perspective view illustrating a solar power system according to an embodiment of the disclosure.
Figure 4:
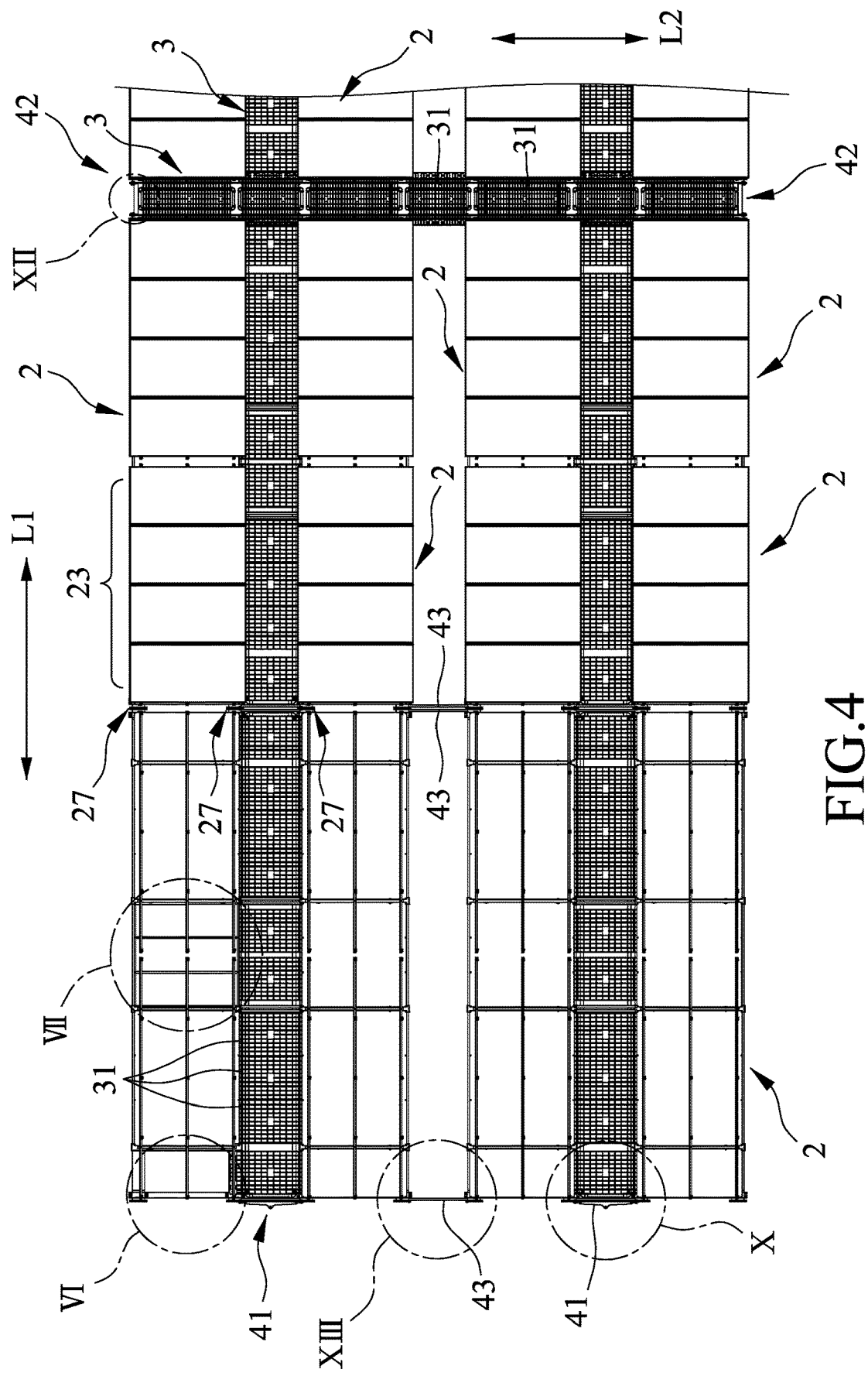
FIG. 4 is a top view of the embodiment illustrating multiple solar panel assemblies of the solar power system, wherein some solar panels and reflectors are omitted to expose some bases of the solar panel assemblies.
Figure 5:
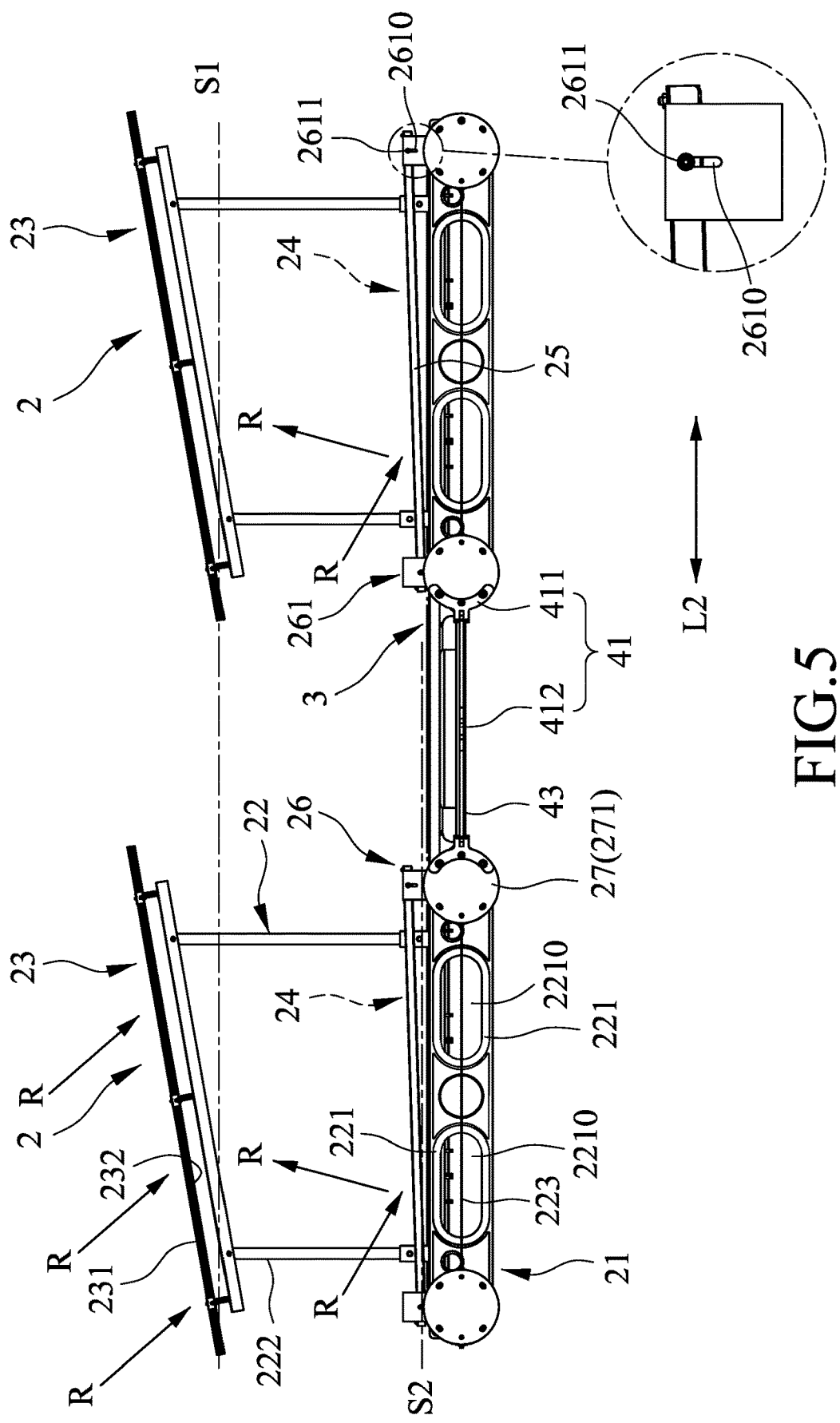
FIG. 5 is a side view illustrating the embodiment.

FIGS. 3 to 5 illustrate a solar power system according to an embodiment of the disclosure. The solar power system includes a plurality of solar panel assemblies 2, a plurality of walkways 3 each of which is disposed between two adjacent ones of the solar panel assemblies 2, an auxiliary unit 4 connecting the solar panel assemblies 2.

Each solar panel assemble 2 includes a base 21, a support unit 22, eight solar power panels 23, a plurality of reflector plates 24, five support grids 25, an inclining unit 26, and four connectors 27.

However, the amounts of the solar power panels 23, the reflector plates 24, the support grids 25, and the connectors 27 are not limited thereto in this embodiment.

As shown in FIG. 3, the base 21 includes, but not limited to, two tubular bodies 211 extending along a first direction (L1) and spaced apart from each other in a second direction (L2) transverse to the first direction (L1). The tubular bodies 211 are configured to float on a water body. The number of the tubular bodies 211 is not limited as long as it can enable the base 21 to float on the water body. In practice, the interior of each tubular body 211 may be filled with foam to increase floatability of the base 21 and to prevent the base 21 from sinking when the surface of the base 21 is damaged. In other embodiments, the base 21 can include a plurality of the tubular bodies 211 spaced apart from and connected to each other along the first direction (L1) and in the second direction (L2) transverse to the first direction (L1) to increase the number of the tubular bodies 211, as well as the floatability of the base 21.

Figure 6:
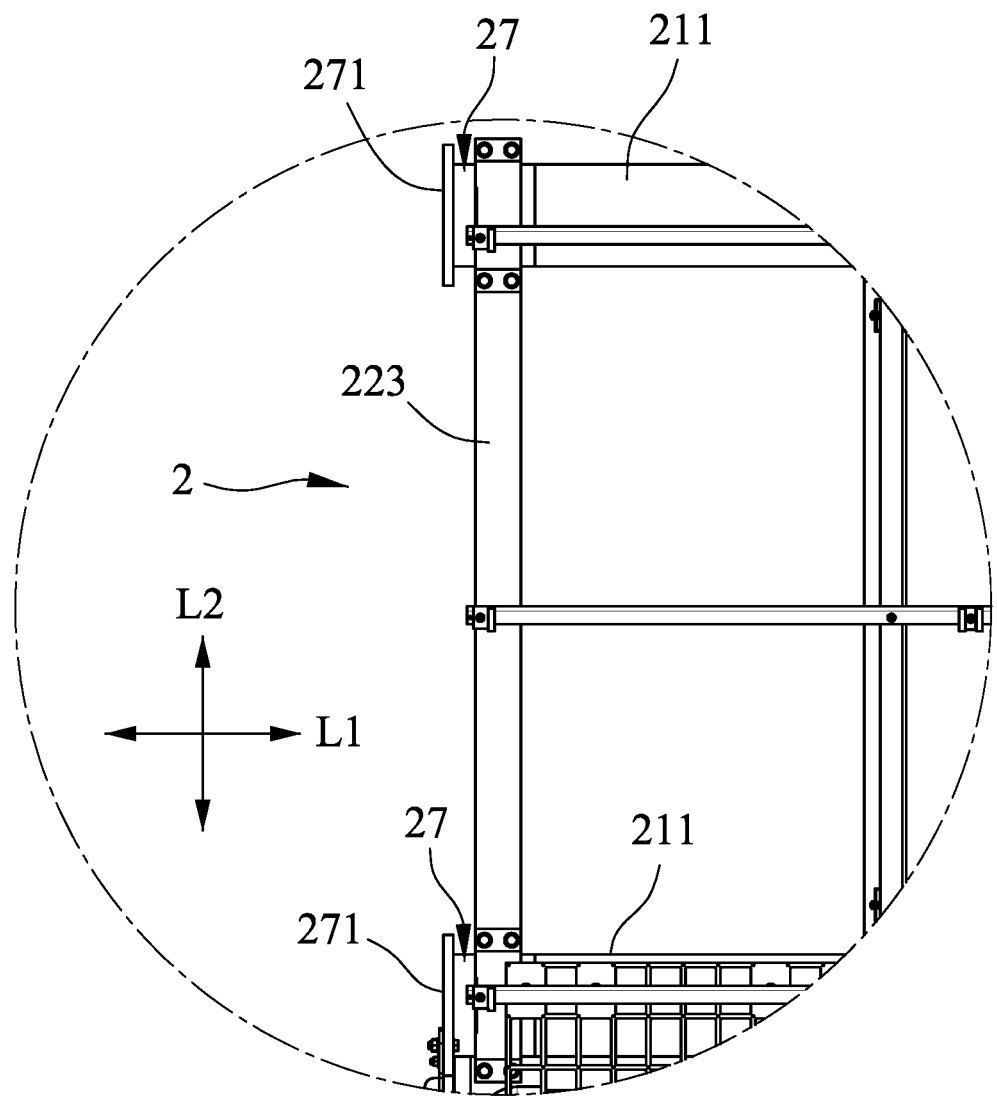
FIG. 6 is an enlarged view taken from encircled region VI of FIG. 4.

Referring to FIG. 6, in combination of FIGS. 3 to 5, the support unit 22 is disposed on the base 21. The support unit 22 includes four supporting frames 221, eight supporting rods 222 (only four shown in FIG. 3), and two positioning cross bars 223 (only one shown in FIGS. 3 and 6). The supporting frames 221 are spaced apart from each other and connected between the tubular bodies 211. Each supporting frame 221 has two spaced apart water passage holes 2210 for passage of water so as to decrease water impact on the respective supporting frame 221 and to increase the entire floatability when the entire weight is excessively increased. The supporting rods 222 are spaced apart from each other and extend upwardly from the supporting frames 221. Each positioning cross bar 223 is transverse to and connects the tubular bodies 211. The positioning cross bars 223 will be detailed further hereinafter. Note that the amounts of the supporting frames 221, the supporting rods 222, and the positioning cross bars 223 are not limited to that described hereinbefore in this embodiment, and may vary depending on the specifications of the tubular bodies 211.

Referring back to FIGS. 3 to 5, the solar power panels 23 are obliquely disposed on the supporting rods 222. Each solar power panel has a top surface 231 and a bottom surface 232 opposite to the top surface 231. The bottom surface 232 faces the base 21. The top and bottom surface 231, 232 are configured to convert light energy into electrical energy. To obtain high efficiency of power conversion, each solar power panel 23 is inclined with respect to an imaginary plane (S1) parallel to the base 21 and passing through each solar power panel 23; an angle formed between the imaginary plane (S1) and the bottom surface 232 of each solar power panel 23 ranges from 10 to 25 degrees. In this embodiment, four juxtaposed solar panels 23 are formed into one set and are supported by four supporting rods 222 (only two supporting rods 222 are shown in FIG. 3 for each set). Two sets of the solar panels 23 are spaced apart from each other and mounted to the base 21. However, the arrangement of the solar panels 23 is not limited hereto as long as the solar panels 23 can be disposed on the supporting rods 222.

Referring back to FIGS. 3 to 5, the reflector plates 24 are disposed between the base 21 and the solar panels 23 to reflect light rays to the bottom surfaces 232 of the solar panels 23. The reflector plates 24 are inclined with respect to an imaginary plane (S2) parallel to the base 21 and passing through the reflector plates 24; an angle between each reflector plate 24 and the imaginary plate (S2) ranges between 0 and 5 degrees. The reflector plates 24 and the solar power panels 23 are inclined in the same direction. In this embodiment, each reflector plate 24 is a light-reflecting plastic board or a light-reflecting plastic film. In other embodiments, each reflector plate 24 may have a metallic layer and a reflecting layer coated on the metallic layer. The reflecting layer is made of a retro-reflective material.

Figure 7:
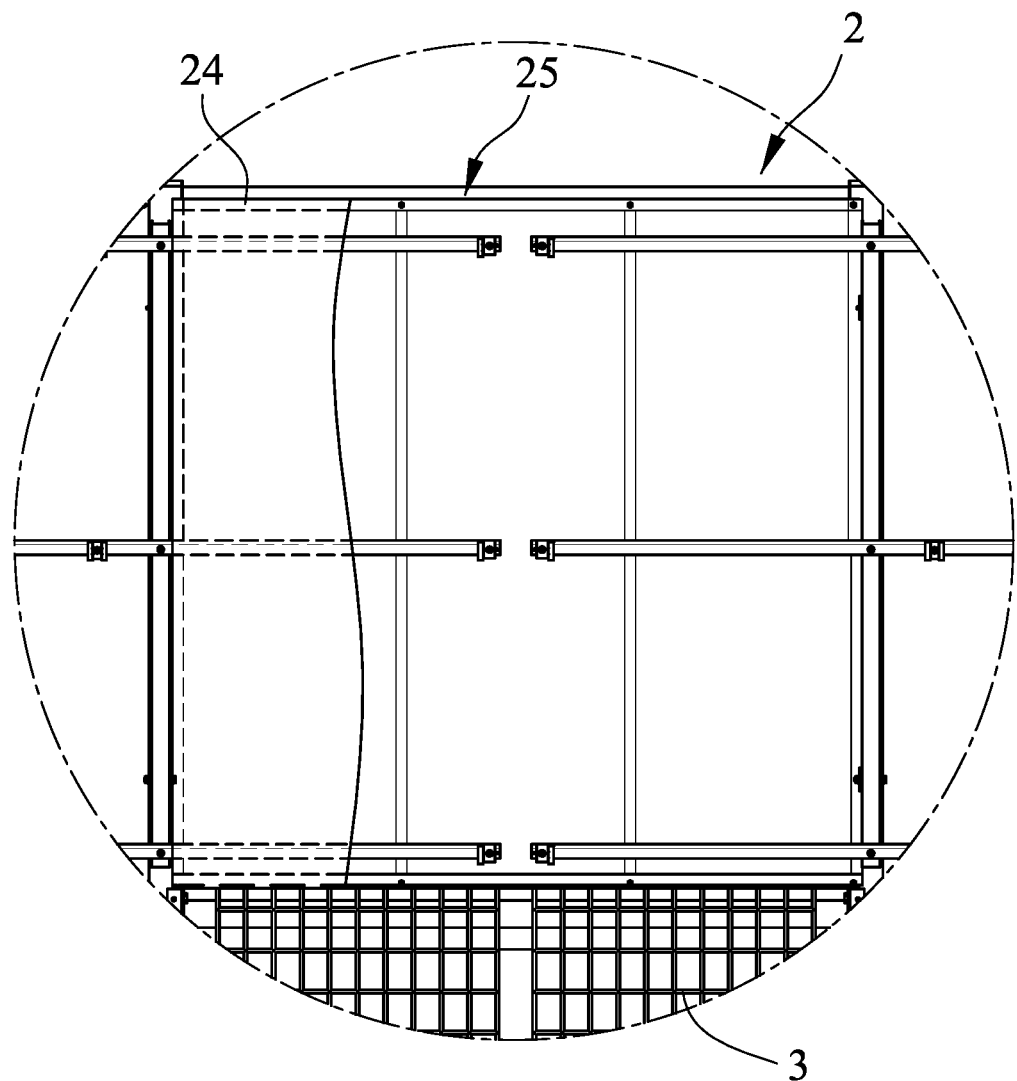
FIG. 7 is an enlarged view taken from encircled region VII of FIG. 4.

Referring to FIG. 7, in combination of FIGS. 3 and 5, each support grid 25 is disposed beneath and connected to one of the reflector plates 24 (part of the reflector plate 24 is removed in FIG. 7 to expose the support grid 25). The support grids 25 may be different in size to support the reflector plates 24 which are differently sized. Each support grid 25 is inclined together with the respective reflector plate 24 with respect to the imaginary plane (S2). Each support grid 25 may be connected to one or more reflector plates 24. The use of the support grids 25 is optional and may be dispensed with in the embodiment.

Referring back to FIGS. 3 and 5, the inclining unit 26 includes a plurality of adjustment members 261 disposed on the tubular bodies 211. Each adjustment member 261 is connected to one of two opposite sides of the respective reflector plate 24 to adjust inclination of the respective reflector plate 24. Each adjustment member 261 has an adjustment slot 2610 elongated in a top-bottom direction, and a bolt 2611 extending through the adjustment slot 2610, movable along the adjustment slot 2610, and connected to the respective reflector plate 24.

Figure 8:
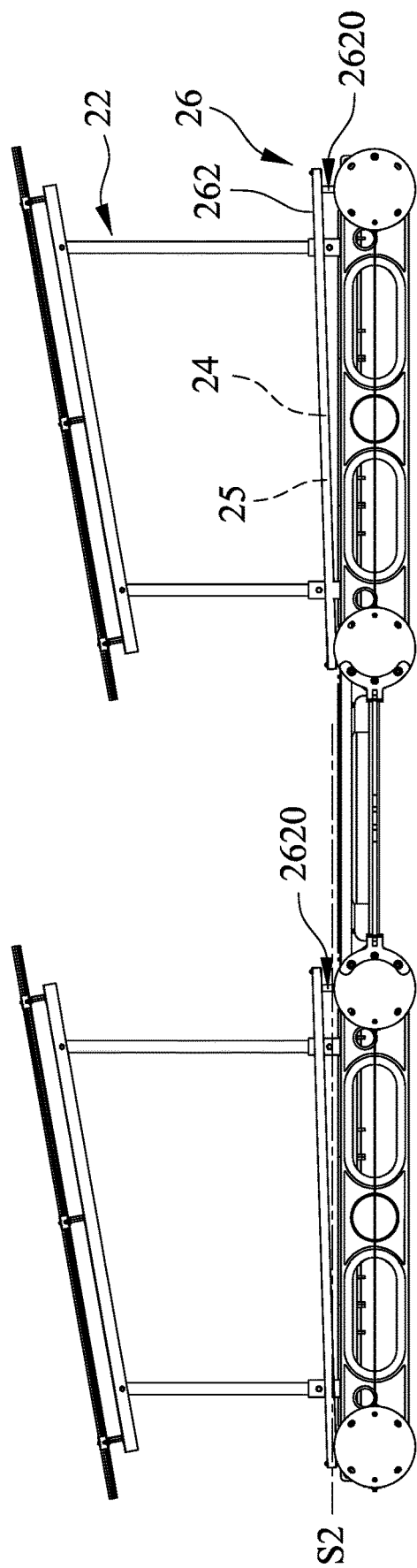
FIG. 8 is a side view illustrating an inclining unit of the embodiment.
Figure 9:
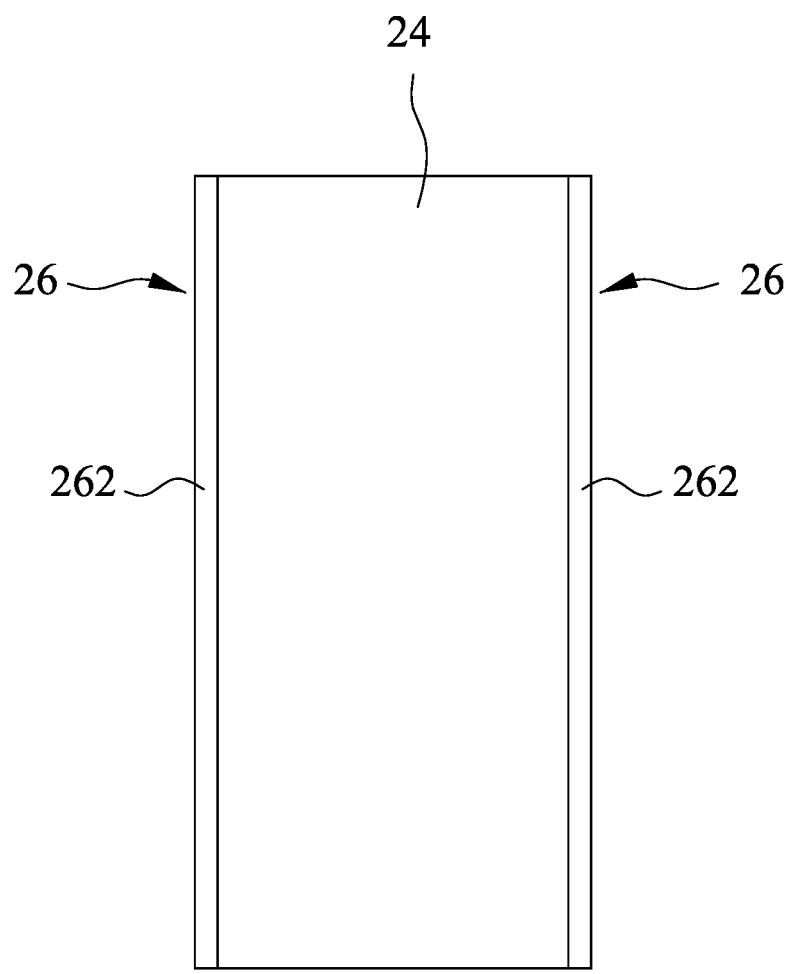
FIG. 9 is a top view illustrating edge strips of the inclining unit fitted on a reflector plate of the embodiment.

FIGS. 8 and 9 illustrate a variant of the inclining unit 26. The variant of the inclining unit 26 includes a plurality of edge strips 262. Every two of the edge strips 262 are respectively fitted to two opposite edges of one of the reflector plates 24 and disposed on the base in an inclined position. Each edge strip 262 has a downwardly extending post 2620 connected to the tubular bodies 211 to place the respective reflector plate 24 and the edge strip 262 in an inclined position on the base 21. The edge strips 262 stably maintain the angle formed between the reflector plates 24 and the imaginary plane (S2). Therefore, when the reflector plates 24 are impacted by external forces, the inclination angles of the reflector plates 24 will not change, thereby avoiding adverse effect to the reflector plates 24. Referring back to FIGS. 4, 5, 7 and 8, the inclining unit 26 may also be connected to the support grids 25 to control the inclinations of the reflector plates 24.

Referring back to FIGS. 3 to 6, each connector 27 is attached to an end of one of the tubular bodies 211. Each connector 27 is, but not limited to, a flanged cap that is sleeved on the end of one of the tubular bodies 211 and has an annular flange 271. The bases 21 of the solar panel assemblies 2 juxtaposed with each other are interconnected using the connectors 27.

Particularly, one of the connectors 27 of each of the solar panel assemblies 2 is joined to an adjacent one of the connectors 27 of another one of the solar panel assemblies 2 along the first direction (L1) such that the bases 21 of the solar panel assemblies 2 are juxtaposed with each other along the first direction (L1) (see FIG. 4).

Referring back to FIGS. 3, 5 and 6, the positioning cross bars 223 are respectively disposed at two opposite lateral sides of the base 21 of each solar panel assembly 2 (only one positioning cross bar 223 is shown for each solar panel assembly). Each positioning cross bar 223 is connected between two connectors 27 spaced apart along the second direction (L2) to enhance the structural strength at two opposite lateral sides of the base 21. By virtue of the positioning cross bar 223 connected between the tubular bodies 211 through the connectors 27, the base 21 is prevented from becoming dismantled by sea wave impacts.

Referring back to FIGS. 5 and 8, the adjustment members 261 or the edge strips 262 are supported on the connectors 27 and connect the reflector plates 24 located on the base 21.

Referring back to FIG. 4, the bases 21 of the solar panel assemblies 2 are connected to each other in a spaced apart manner along the second direction (L2).

The connection as such can be understood from the description hereinafter.

Figure 10:
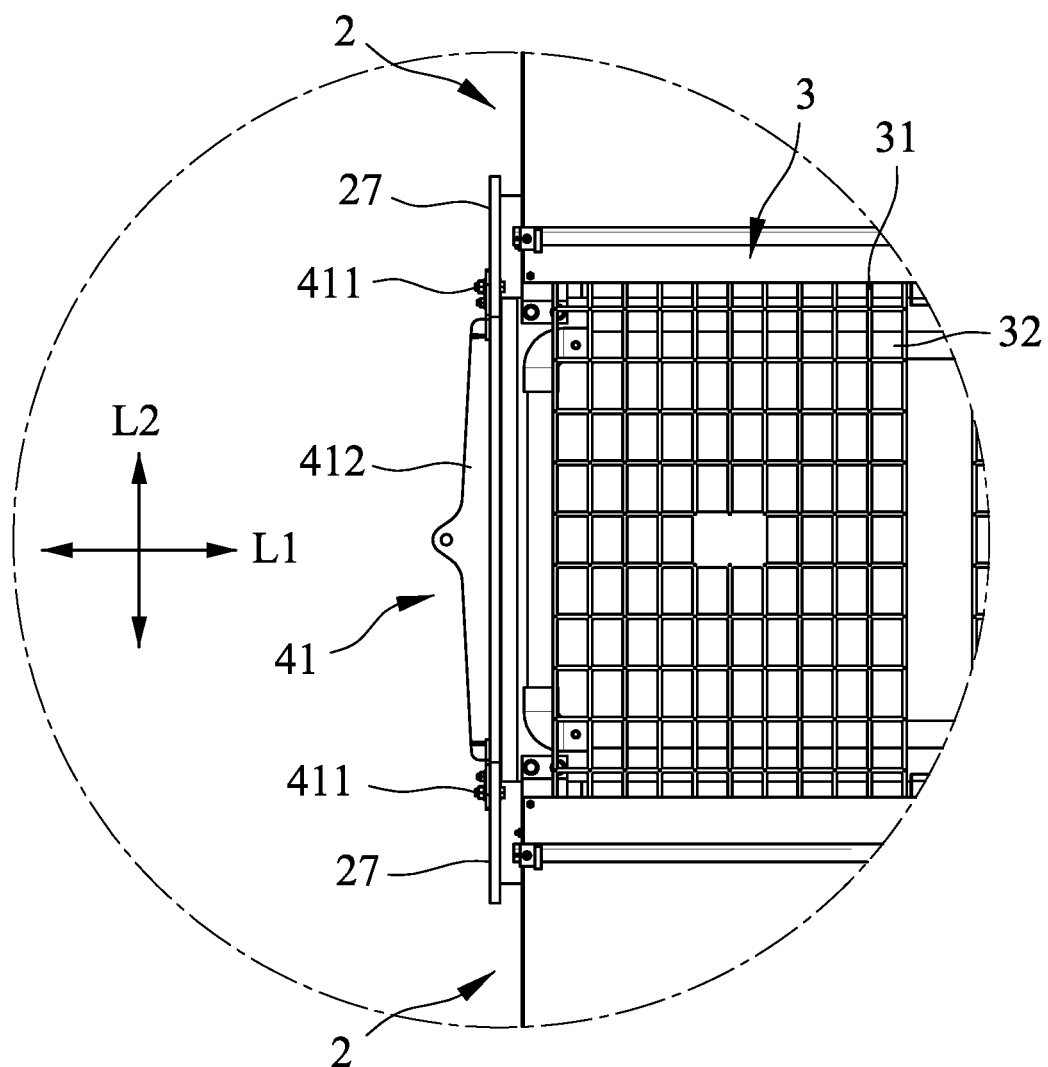
FIG. 10 is an enlarged view taken from encircled region X of FIG. 4.
Figure 11:
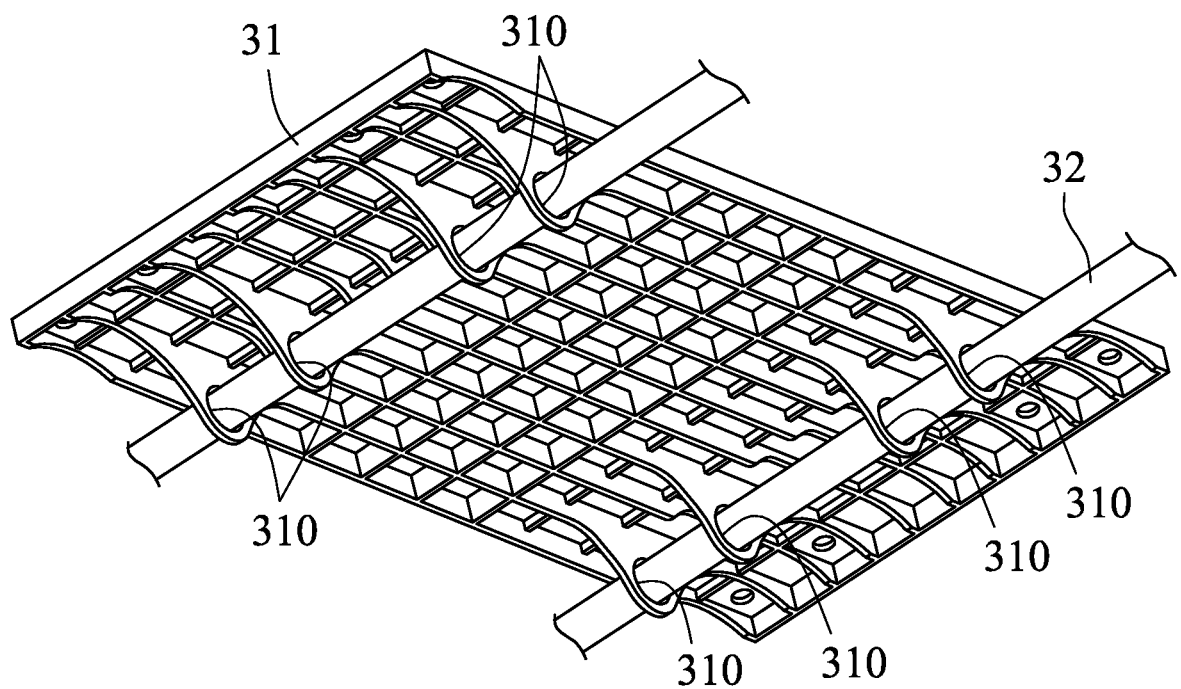
FIG. 11 in a fragmentary perspective view illustrating a foot plate and reinforcement rods of the embodiment.

Referring to FIGS. 10 and 11, in combination of FIG. 4, the walkways 3 extends in the first and second directions (L1, L2), and are each disposed between two adjacent ones of the bases 21 of the solar panel assemblies 2, which are spaced apart in the first or second direction (L1 or L2). Each walkway 3 includes a plurality of foot plates 31 and reinforcement rods 32. The foot plates 31 are successively disposed between the tubular bodies 211 of two adjacent ones of the solar panel assemblies 2. Each foot plate 31 has a bottom surface and a plurality of spaced apart mounting holes 310 disposed on the bottom surface. The reinforcement rods 32 thread through the mounting holes 310 and interconnect the foot plates 31. The foot plates 31 are convenient for a user to overhaul the solar panel assemblies 2. The reinforcement rods 32 increase the loading capacity and structural strength of the foot plates 31.

As shown in FIGS. 4, 5 and 10, the auxiliary unit 4 includes a plurality of first auxiliary connectors 41, second auxiliary connectors 42, and third auxiliary connectors 43. The first auxiliary connectors 41 extend along the second direction (L2) and connect the connectors 27 of the solar panel assemblies 2 spaced apart from each other along the second direction (L2). The first auxiliary connectors 41 are disposed below the walkways 3. Each first auxiliary connector 41 has two end plates 411 and a first connecting bar 412. The end plates 411 are respectively screwed to two connectors 27 respectively attached to the bases 21 of two solar panel assemblies 2 spaced apart from each other along the second direction (L2). The first connecting bar 412 connects between the end plates 411 and bridges the bases 21 of two adjacent ones of the solar panel assemblies 2 spaced apart from each other along the second direction (L2). Each first auxiliary connector 41 can stabilize connection of two adjacent ones of the solar panel assemblies 2 spaced apart from each other along the second direction (L2).

Figure 12:
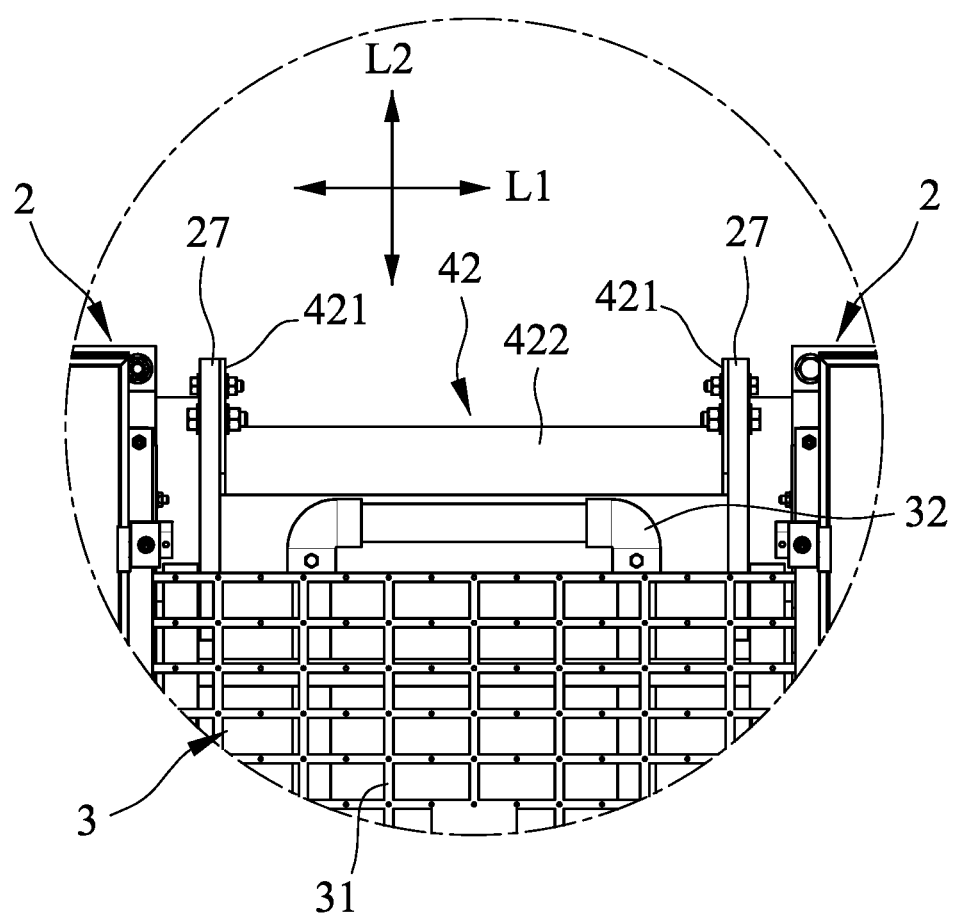
FIG. 12 is an enlarged view taken from encircled region XII of FIG. 4.

Referring to FIG. 12, in combination of FIG. 4, the second auxiliary connectors 42 extend along the first direction (L1) and connect the bases 21 of the solar panel assemblies 2 spaced apart from each other in the first direction (L1). Each second auxiliary connectors 42 has two end flanges 421 and a second connecting bar 422. The end flanges 421 are respectively connected or screwed to two connectors 27 respectively attached to the bases 21 of two solar panel assemblies 2 spaced apart along the first direction (L1). The second connecting bar 422 connects between the end flanges 421. In this embodiment, the second connecting bar 422 is, but not limited to, a tubular member, and the end flanges 421 are annular flanges integral with the tubular member.

Figure 13:
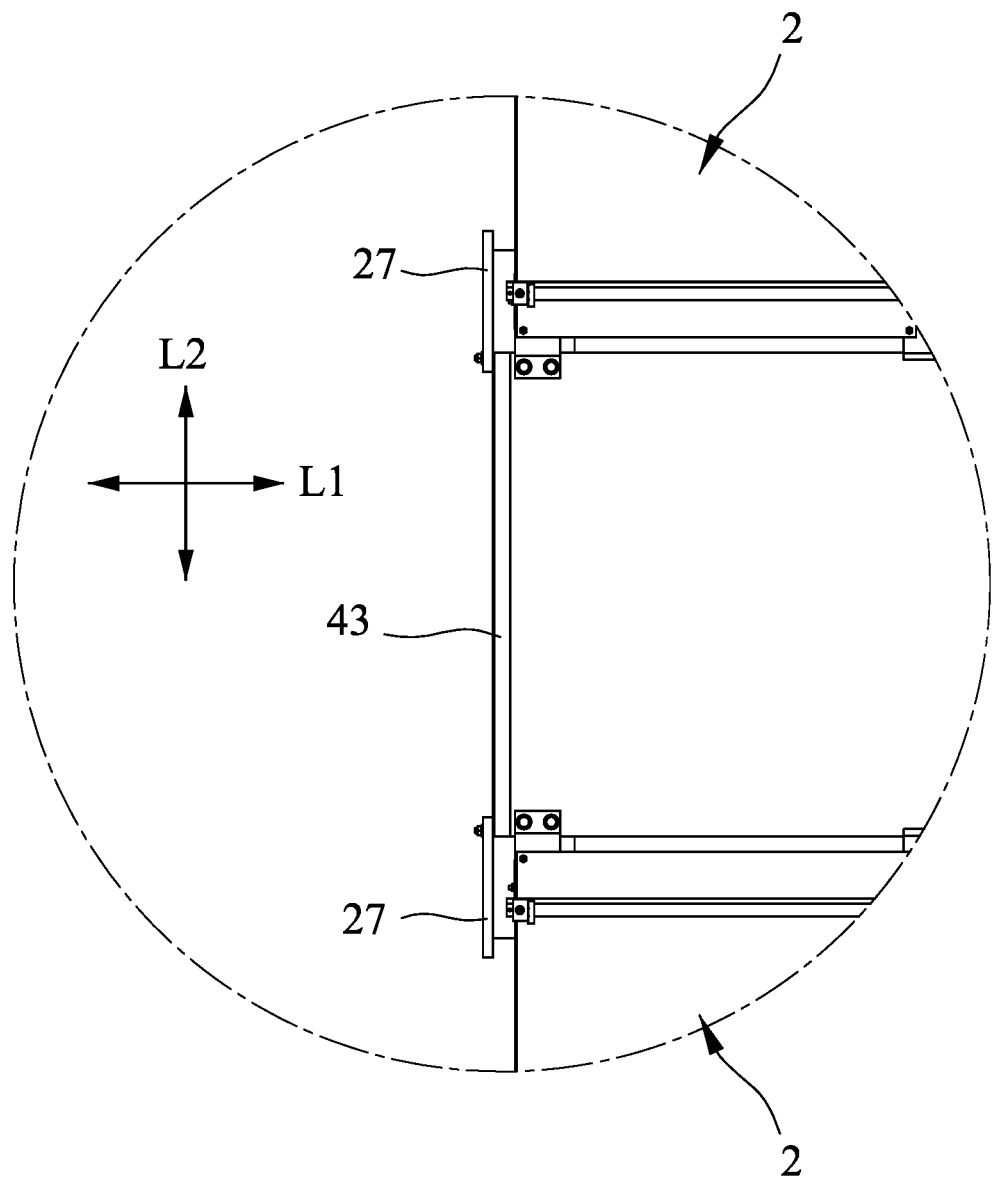
FIG. 13 is an enlarged view taken from encircled region XIII of FIG. 4.

Referring to FIG. 13, in combination of FIGS. 4 and 5, the third auxiliary connectors 43 extending along the second direction (L2). Each third auxiliary connector 43 is in the form of a bar and connects between two of the connectors 27 respectively attached to the bases 21 of two solar panel assemblies 2 spaced apart from each other along the second direction (L2). Each third auxiliary connector 43 can be, but not limited, screwed or welded between two connectors 27 respectively attached to the bases 21 of two solar panel assemblies 2 spaced apart from each other along the second direction (L2). By virtue of the first, second and third auxiliary connectors 41, 42, 43 in connection with the connectors 27, the entire structural strength of the solar power system can be enhanced.

Reference is made to FIGS. 3 to 5. A photovoltaic power generation process takes place when sunlight rays (R) are incident on the top surfaces 231 of the solar power panels 23. The reflector plates 24 reflect the sunlight rays (R) missing the top surfaces 231 back to the bottom surfaces 232 of the solar power panels 23, and the bottom surfaces 232 absorb the reflected light to convert the solar energy into the electrical energy. By virtue of the top and bottom surfaces 231, 232 of the solar power panels 23 and the disposition of the reflector plates 24, the sunlight rays (R) of different angles can be trapped and absorbed by the solar power panels 23 so that the solar power system can increase overall power generation. In addition, due to the cooperation of the support units 22, the connectors 27, and the auxiliary unit 4, the solar panel assemblies 2 can be arranged in a matrix manner on the water body. Modularization of the solar power system can be effectively enhanced. In addition, it is effective to securely interconnect the solar panel assemblies 2 and is convenient to overhaul the solar power system. The solar power system of this embodiment can be used for converting the solar energy into the electrical energy via solar photovoltaic technologies, or concentrating solar power technologies.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A solar panel assembly, comprising:
   a base including a plurality of tubular bodies extending along a first direction and spaced apart from each other in a second direction transverse to the first direction, said tubular bodies being configured to float on a water body;
   a support unit disposed on said base, and including a plurality of supporting frames connected between said tubular bodies and a plurality of supporting rods extending upwardly from said supporting frames;
   at least one solar power panel obliquely disposed on said supporting rods, said at least one solar power panel having a top surface and a bottom surface opposite to said top surface, said top and bottom surface being configured to convert light energy into electrical energy;

at least one reflector plate disposed between said base and said at least one solar panel to reflect light rays to said bottom surface; and a plurality of adjustment members connected to said base and two opposite sides of said at least one reflector plate to adjust inclination of said at least one reflector plate;

wherein each of said adjustment members has only one adjustment slot elongated in a top-bottom direction, and only one bolt extending through said adjustment slot, movable along said adjustment slot, and connected to said at least one reflector plate, said bolt having an enlarged head portion greater in width along a direction perpendicular to the top-bottom direction than said adjustment slot;

wherein said solar panel assembly further comprises two edge strips respectively fitted to two opposite edges of said at least one reflector plate and connected to said base in an inclined position; and wherein each of said edge strips has a downwardly extending post connected to said tubular bodies to place said at least one reflector plate and a respective one of said edge strips in an inclined position on said base.

2. The solar panel assembly as claimed in claim 1, wherein said at least one reflector plate is inclined at an angle ranging between 0 and 5 degrees with respect to an imaginary plane parallel to said base and passing through said at least one reflector plate, said at least one reflector plate and said at least one solar power panel being inclined in the same direction.

3. The solar panel assembly as claimed in claim 1, comprising a plurality of connectors each of which is disposed on an end of one of said tubular bodies.

4. The solar panel assembly as claimed in claim 3, wherein said support unit further includes a plurality of positioning cross bars, each of which is transverse to said tubular bodies and connected between two of said connectors.

5. The solar panel assembly as claimed in claim 3, wherein each of said connectors is a flanged cap that is sleeved on said end of one of said tubular bodies.

6. The solar panel assembly as claimed in claim 1, wherein said at least one reflector plate is made of plastic.

7. The solar panel assembly as claimed in claim 1, wherein said at least one reflector plate has a metallic layer and a reflecting layer coated on said metallic layer, said reflecting layer is made of retro-reflective material.

8. The solar panel assembly as claimed in claim 1, wherein:

said at least one reflector plate includes a plurality of reflector plates;

said solar panel assembly includes a plurality of support grids each of which is disposed beneath and connected to one of said reflector plates.

9. The solar panel assembly as claimed in claim 1, wherein said at least one solar power panel is inclined at an angle ranging between 10 and 25 degrees with respect to an imaginary plane parallel to said base and passing through said at least one solar power panel.

* * * * *